(12) United States Patent
Mizunaga et al.

(10) Patent No.: US 11,208,725 B2
(45) Date of Patent: Dec. 28, 2021

(54) SUBSTRATE PROCESSING APPARATUS

(71) Applicant: Tokyo Electron Limited, Tokyo (JP)

(72) Inventors: Kouichi Mizunaga, Koshi (JP);
Masami Akimoto, Koshi (JP); Satoshi Morita, Koshi (JP); Katsuhiro Morikawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 91 days.

(21) Appl. No.: 16/583,628

(22) Filed: Sep. 26, 2019

(65) Prior Publication Data

US 2020/0102654 A1 Apr. 2, 2020

(30) Foreign Application Priority Data

Sep. 27, 2018 (JP) .............................. JP2018-182832

(51) Int. Cl.
| | |
|---|---|
| *C23C 18/16* | (2006.01) |
| *H01L 21/683* | (2006.01) |
| *H01L 21/67* | (2006.01) |
| *B05C 13/02* | (2006.01) |

(52) U.S. Cl.
CPC ............ *C23C 18/163* (2013.01); *B05C 13/02* (2013.01); *H01L 21/67103* (2013.01); *H01L 21/6838* (2013.01)

(58) Field of Classification Search
None
See application file for complete search history.

(56) References Cited

U.S. PATENT DOCUMENTS

| | | | |
|---|---|---|---|
| 2004/0131766 A1* | 7/2004 | Katsuoka | ............ C23C 18/1886 427/98.5 |
| 2006/0151014 A1* | 7/2006 | Obweger | .......... H01L 21/67057 134/94.1 |
| 2008/0056857 A1* | 3/2008 | Hiroki | .................. H01L 21/681 414/217.1 |
| 2009/0277379 A1* | 11/2009 | Ohmi | ..................... G03F 7/162 118/302 |
| 2009/0285991 A1* | 11/2009 | Kitano | .................... G03F 7/162 427/346 |
| 2010/0206481 A1* | 8/2010 | Gigacher | .......... H01L 21/67051 156/345.21 |

(Continued)

FOREIGN PATENT DOCUMENTS

JP 2002-219424 A 8/2002

*Primary Examiner* — Jethro M. Pence
(74) *Attorney, Agent, or Firm* — Pearne & Gordon LLP

(57) ABSTRACT

A substrate processing apparatus includes a rotary table comprising a base plate having a front surface where at least one suction hole is provided and an attraction plate having a front surface contacted with a non-processing surface of a substrate to attract the substrate, a rear surface contacted with the front surface of the base plate, and at least one through hole through which the front surface and the rear surface are connected; a rotation driving device configured to rotate the rotary table around a rotation axis; and a suction device configured to act a suction force on the suction hole, to contact the base plate with the attraction plate by acting the suction force between the base plate and the attraction plate, and to firmly contact the attraction plate with the substrate by acting the suction force between the attraction plate and the substrate through the through hole.

17 Claims, 10 Drawing Sheets

(56) References Cited

U.S. PATENT DOCUMENTS

| | | | |
|---|---|---|---|
| 2013/0171831 A1* | 7/2013 | Namba | H01L 21/30604 438/748 |
| 2014/0008855 A1* | 1/2014 | Cheng | H01L 21/6838 269/21 |
| 2015/0020853 A1* | 1/2015 | Maejima | H01L 21/67051 134/104.2 |
| 2016/0177450 A1* | 6/2016 | Kanno | C23C 16/45536 427/535 |
| 2018/0117641 A1* | 5/2018 | Jung | H01L 21/6715 |
| 2018/0151343 A1* | 5/2018 | Takiguchi | B24B 37/10 |
| 2018/0233385 A1* | 8/2018 | Iwata | B32B 43/006 |

* cited by examiner

SUBSTRATE PROCESSING APPARATUS

CROSS-REFERENCE TO RELATED APPLICATION

This application claims the benefit of Japanese Patent Application No. 2018-182832 filed on Sep. 27, 2018, the entire disclosure of which is incorporated herein by reference.

TECHNICAL FIELD

The various aspects and embodiments described herein pertain generally to a substrate processing apparatus.

BACKGROUND

In the manufacture of a semiconductor device, a wide variety of liquid processings such as a chemical liquid cleaning processing, a plating processing and a developing processing are performed on a substrate such as a semiconductor wafer. As an apparatus configured to perform such a liquid processing, there is known a single-wafer liquid processing apparatus, and an example of this single-wafer liquid processing apparatus is described in Patent Document 1.

The substrate processing apparatus of Patent Document 1 is equipped with a spin chuck capable of holding the substrate horizontally and rotating the substrate around a vertical axis. The substrate is held by a plurality of holding members provided at a peripheral portion of the spin chuck at a regular distance along a circumferential direction thereof. A circular plate-shaped top surface moving member and a circular plate-shaped bottom surface moving member each having a heater embedded therein are respectively disposed above and under the substrate held by the spin chuck. In the substrate processing apparatus of Patent Document 1, processings are performed in the following sequence.

First, the substrate is held by the spin chuck, and by raising the bottom surface moving member, a first gap is formed between a bottom surface (rear surface) of the substrate and a top surface of the bottom surface moving member. Then, a temperature-controlled chemical liquid is supplied into this first gap from a bottom surface supply passageway opened at a central portion of the top surface of the bottom surface moving member, so that the first gap is filled with the chemical liquid for surface processing. The chemical liquid is adjusted to have a preset temperature by the heater of the bottom surface moving member. In the meanwhile, a top surface supply nozzle is placed above a top surface (front surface) of the substrate to supply the chemical liquid for surface processing, so that a puddle of the chemical liquid is formed on the top surface of the substrate. Subsequently, the top surface supply nozzle is retreated from above the substrate, and the top surface moving member is lowered, so that a small second gap is formed between a bottom surface of the top surface moving member and a front surface (top surface) of the puddle of the chemical liquid. The puddle of the chemical liquid is adjusted to have a preset temperature by the heater embedded in the top surface moving member. In this state, a chemical liquid processing is performed on the front and rear surfaces of the substrate while rotating the substrate at a low speed or without rotating the substrate. During the chemical liquid processing, if necessary, the chemical liquid is replenished onto the top surface and the rear surface of the substrate from a chemical liquid supply passageway opened at a central portion of the top surface moving member and the aforementioned bottom surface supply passageway.

In the substrate processing apparatus of Patent Document 1, the substrate is heated by a fluid (a processing liquid and/or a gas) existing between the substrate and the heater.

Patent Document 1: Japanese Patent Laid-open Publication No. 2002-219424

SUMMARY

In one exemplary embodiment, a substrate processing apparatus includes a rotary table comprising a base plate and an attraction plate, the base plate having a front surface in which at least one suction hole is provided, and the attraction plate having a front surface contacted with a non-processing surface of a substrate to attract the substrate; a rear surface contacted with the front surface of the base plate; and at least one through hole through which the front surface and the rear surface are connected; a rotation driving device configured to rotate the rotary table around a rotation axis; and a suction device configured to act a suction force on the at least one suction hole of the base plate, configured to firmly contact the base plate with the attraction plate by acting the suction force between the base plate and the attraction plate, and configured to firmly contact the attraction plate with the substrate by acting the suction force between the attraction plate and the substrate through the at least one through hole.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
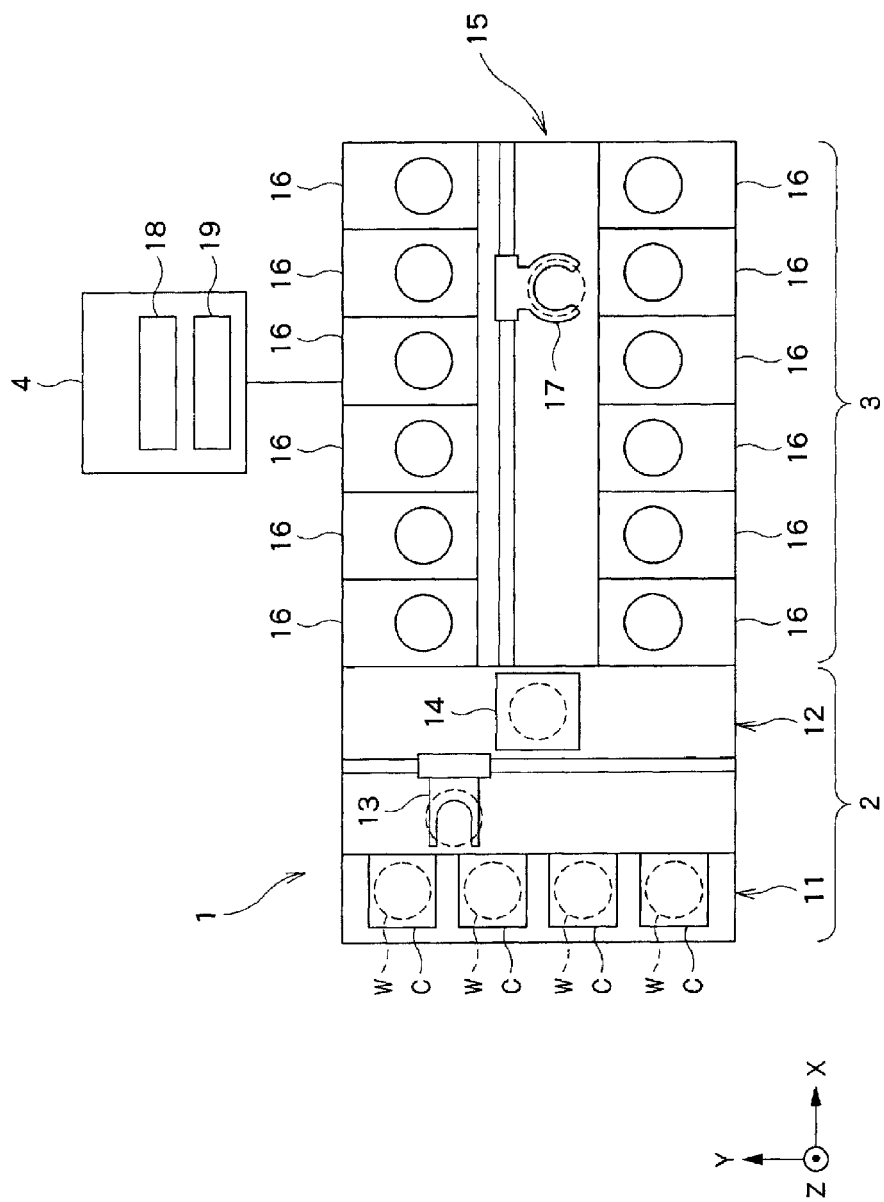
FIG. 1 is a schematic plan view illustrating an overall configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus (substrate processing system) according to an exemplary embodiment will be described with reference to the accompanying drawings.

FIG. 1 is a plan view illustrating an outline of the substrate processing system according to the exemplary embodiment. In the following, in order to clarify positional relationships, the X-axis, the Y-axis and the Z-axis which are orthogonal to each other will be defined. The positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, carriers C each accommodating semiconductor wafers W (hereinafter, referred to as "wafers W") horizontally are placed.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafer W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing unit 16 by using the wafer holding mechanism.

The processing units 16 perform a predetermined substrate processing on the wafer W transferred by the substrate transfer device 17.

Further, the substrate processing system 1 is equipped with a control device 4. The control device 4 is, for example, a computer, and includes a controller 18 and a storage 19. The storage 19 stores therein a program that controls various processings performed in the substrate processing system 1. The controller 18 controls the operation of the substrate processing system 1 by reading and executing the program stored in the storage 19.

Further, the program may be recorded in a computer-readable recording medium and may be installed to the storage 19 of the control device 4 from this recording medium. The computer-readable recording medium may be, by way of non-limiting example, a hard disk (HD), a flexible disk (FD), a compact disk (CD), a magnet optical disk (MO), a memory card, or the like.

In the substrate processing system 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, and then taken out from the processing unit 16 and placed on the delivery unit 14 by the substrate transfer device 17. After the processing of placing the wafer W on the delivery unit 14, the wafer W returns back into the carrier C of the carrier placing section 11 by the substrate transfer device 13.

Now, a configuration of the processing unit 16 according to the exemplary embodiment will be explained. The processing unit 16 is configured as a single-wafer dip liquid processing unit.

Figure 2:
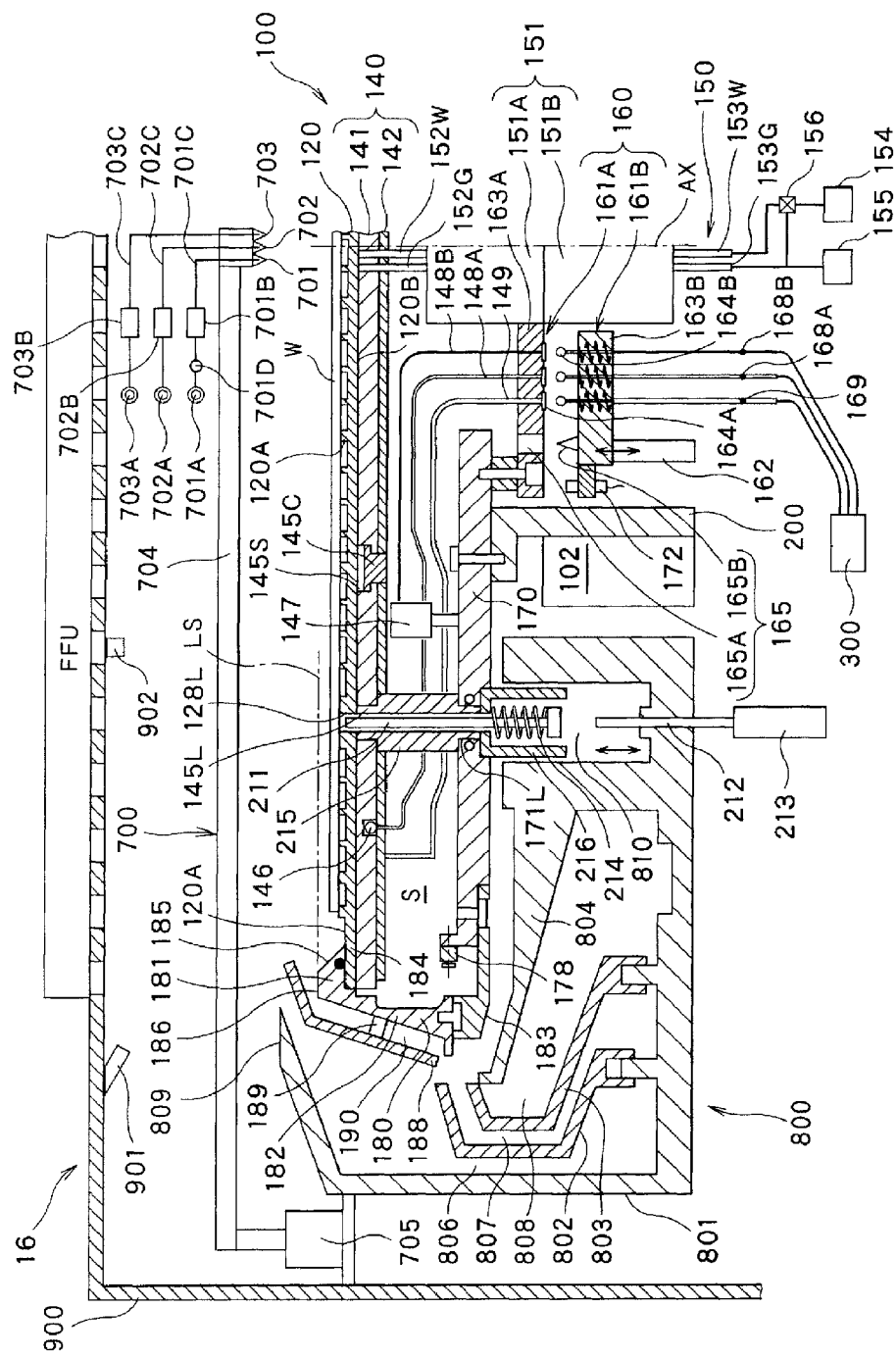
FIG. 2 is a schematic cross sectional view illustrating an example configuration of a processing unit provided in the substrate processing apparatus of FIG. 1.

As depicted in FIG. 2, the processing unit 16 is equipped with a rotary table 100, a processing liquid supply 700 configured to supply a processing liquid onto the wafer W, and a liquid recovery cup (processing cup) 800 configured to receive the processing liquid scattered from the substrate being rotated. The rotary table 100 is capable of holding and rotating a circular substrate such as the wafer W horizontally. The constituent components of the processing unit 16 such as the rotary table 100, the processing liquid supply 700 and the liquid recovery cup 800 are accommodated in a housing 900 (also referred to as a "processing chamber"). FIG. 2 illustrates only a left half of the processing unit 16.

The rotary table 100 includes an attraction plate 120, a hot plate 140, a support plate 170, a periphery cover body 180 and a hollow rotation shaft 200. The attraction plate 120 is configured to attract the wafer W placed thereon horizontally. The hot plate 140 serves as a base plate of the attraction plate 120, and is configured to support and heat the attraction plate 120. The support plate 170 is configured to support the attraction plate 120 and the hot plate 140. The rotation shaft 200 extends downwards from the support plate 170. The rotary table 100 is rotated around a vertically extending rotation axis Ax by an electric driving unit (rotation driving device) 102 disposed around the rotation shaft 200, so that the wafer W held by the rotary table 100 can be rotated around the rotation axis Ax. The electric driving unit 102 (details of which are not illustrated) is configured to transfer a motive power generated by an electric motor to the rotation shaft 200 via a power transmission mechanism (for example, a belt and a pulley) to rotate the rotation shaft 200. Alternatively, the electric driving unit 102 may be configured to rotate the rotation shaft 200 directly by the electric motor.

The attraction plate 120 is a circular plate-shaped member having a diameter slightly larger than a diameter of the wafer W (or equal to the diameter of the wafer W depending on the configuration), that is, having an area larger than or equal to an area of the wafer W. The attraction plate 120 has a top surface (front surface) 120A configured to attract a bottom surface (a surface which is not a processing target) of the wafer W; and a bottom surface (rear surface) 120B which is in contact with a top surface of the hot plate 140. The attraction plate 120 may be made of a material having high thermal conductivity such as thermal conductive ceramics, for example, SiC. Desirably, the thermal conductivity of the material forming the attraction plate 120 is equal to or higher than 150 W/m·k.

The hot plate 140 is a circular plate-shaped member having a diameter substantially equal to the diameter of the attraction plate 120. The hot plate 140 has a plate main body 141 and an electric heater 142 provided in the plate main body 141. The plate main body 141 is made of a material having high thermal conductivity such as thermal conductive ceramics, for example, SiC. Desirably, the thermal conductivity of the material forming the plate main body 141 is equal to or higher than 150 W/m·k.

Figure 3:
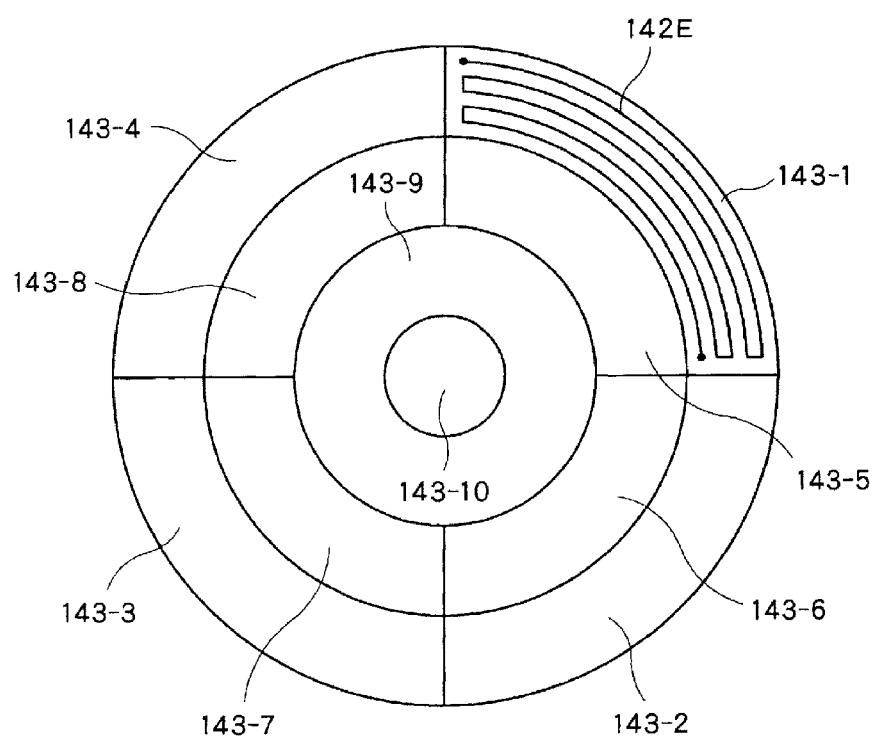
FIG. 3 is a schematic plan view illustrating an example layout of a heater of a hot plate provided in the processing unit.

The heater 142 may be a surface-shaped heater such as a polyimide heater provided on a bottom surface (rear surface) of the plate main body 141. Desirably, a multiple number of (for example, ten) heating zones 143-1 to 143-10 are set in the hot plate 140, as illustrated in FIG. 3. The heater 142 are composed of a multiple number of heater elements 142E respectively provided in the heating zones 143-1 to 143-10. Each heater element 142E is formed of a conductor extending in a zigzag shape within the corresponding one of the heating zones 143-1 to 143-10. FIG. 3 illustrates only the heater element 142E within the heating zone 143-1.

Power can be fed to these heater elements 142E independently by a power feeder 300 to be described later. Accordingly, different heating zones of the wafer W can be heated under different conditions, so that a temperature distribution of the wafer W can be controlled.

Figure 4:
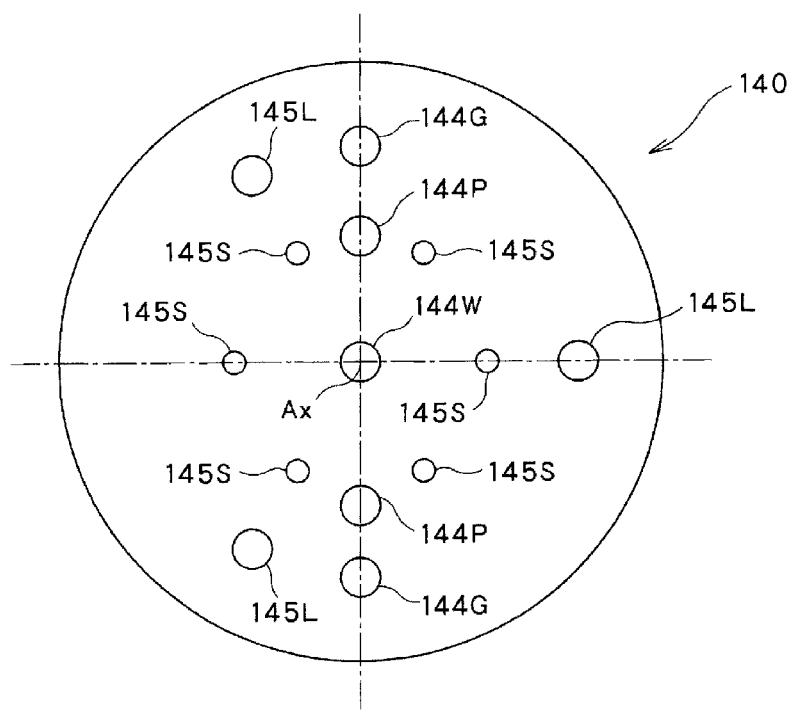
FIG. 4 is a schematic plan view illustrating a top surface of the hot plate.

As shown in FIG. 4, one or more (two in the shown example) plate suction holes 144P, one or more (one at a central portion in the shown example) substrate suction hole 144W, one or more (two at an outer side in the shown example) purge gas supply holes 144G are formed at the top surface (front surface) of the plate main body 141. The plate suction holes 144P are used to transfer a suction force for attracting the attraction plate 120 to the hot plate 140. The substrate suction hole 144W is used to transfer a suction force for attracting the wafer W to the attraction plate 120.

Further, the plate main body 141 is provided with a plurality of (three in the shown example) lift pin holes 145L through which lift pins 211 to be described later pass; and a multiplicity of (six in the shown example) service holes 145S for accessing assembly screws of the rotary table 100. In a typical operation mode, the service holes 145S are closed with caps 145C.

The aforementioned heater elements 142E are arranged, avoiding the plate suction holes 144P, the substrate suction hole 144W, the purge gas supply holes 144G, the lift pin holes 145L and the service holes 145S. Further, by achieving the connection to the rotation shaft 200 through an electromagnet, the service holes may be omitted.

Figure 5:
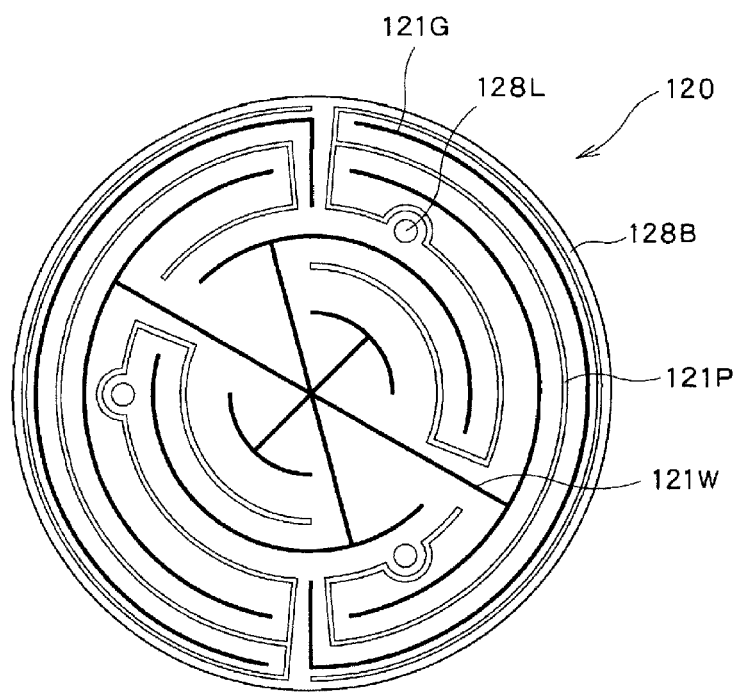
FIG. 5 is a schematic plan view illustrating an example structure of a bottom surface of an attraction plate provided in the processing unit.

As shown in FIG. 5, a plate bottom surface suction path groove 121P, a substrate bottom surface suction path groove 121W, a bottom surface purge path groove 121G are formed at the bottom surface 120B of the attraction plate 120. When the attraction plate 120 is placed on the hot plate 140 with an appropriate positional relationship, at least a part of the plate bottom surface suction path groove 121P communicates with the plate suction hole 144P. Likewise, at least a part of the substrate bottom surface suction path groove 121W communicates with the substrate suction hole 144W, and at least a part of the bottom surface purge path groove 121G communicates with the purge gas supply hole 144G. The plate bottom surface suction path groove 121P, the substrate bottom surface suction path groove 121W and the bottom surface purge path groove 121G are disconnected from each other (do not communicate with each other).

Figure 10:
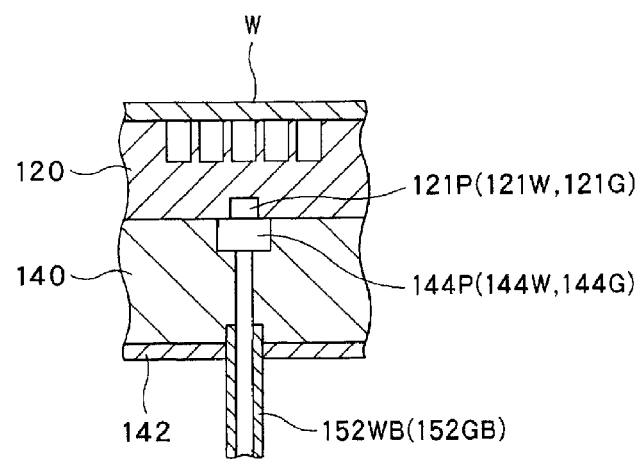
FIG. 10 is a schematic cross sectional view of the attraction plate taken along a plane different from that of FIG. 9.

FIG. 10 schematically illustrates a state in which the suction hole 144P (or 144W, or 144G) of the hot plate 140 are overlapped with and communicate with the path groove 121P (or 121W, or 121G) of the attraction plate 120.

Figure 6:
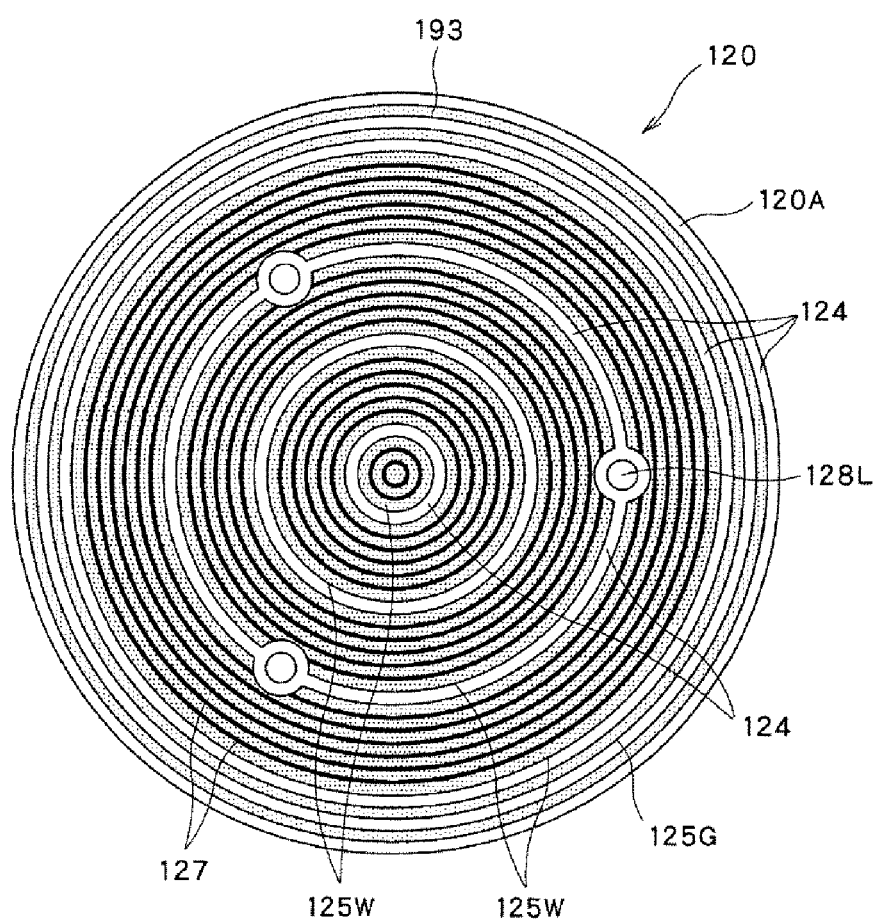
FIG. 6 is a schematic plan view illustrating an example structure of a top surface of the attraction plate.
Figure 9:
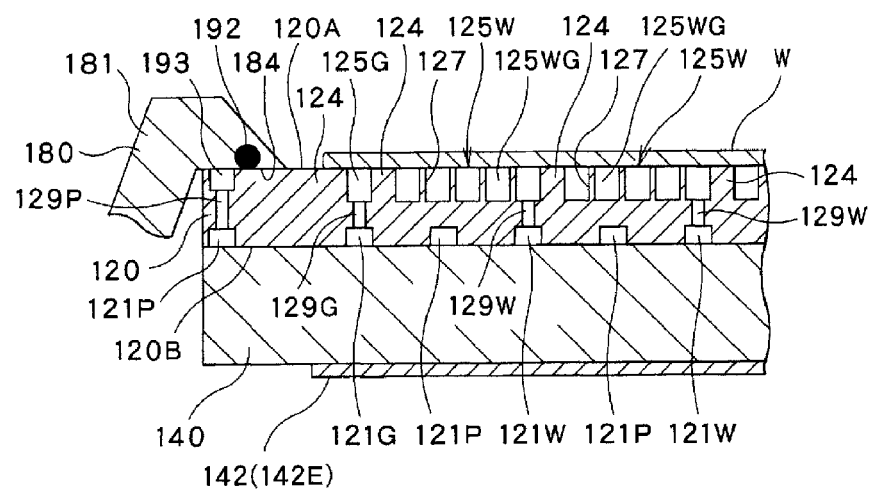
FIG. 9 is a schematic cross sectional view of the attraction plate shown in FIG. 5 and FIG. 6.

As illustrated in FIG. 6 and FIG. 9, a plurality of (five in the shown example) thick ring-shaped partition walls 124 is formed on the top surface 120A of the attraction plate 120. The thick partition walls 124 form, at a top surface, a plurality of recess regions 125W and 125G (four annular regions at outer sides and one circular region at the innermost side) which are disconnected from each other.

Through holes 129W (see FIG. 9), which are formed through the attraction plate 120 in a thickness direction thereof, are formed at the substrate bottom surface suction path groove 121W, and each through hole allows the substrate bottom surface suction path groove 121W to communicate with the corresponding one of the plurality of (four in the shown example) recess regions 125W.

Further, through holes 129G (see FIG. 9), which are formed through the attraction plate 120 in the thickness direction thereof, are formed at the bottom surface purge path groove 121G, and each through hole allows the bottom surface purge path groove 121G to communicate with the outermost recess region 125G. The outermost recess region 125G serves as a top surface purge path groove having a single circular ring shape.

Substantially ring-shaped narrow separation walls 127 are concentrically provided within each of the four recess regions 125W located at the inner side. The narrow separation wall 127 forms at least one top surface suction path groove 125WG which extends in a zigzag shape within each recess region 125W. That is, the narrow separation wall 127 serves to distribute the suction force in a uniform manner within each recess region 125W.

Figure 11:
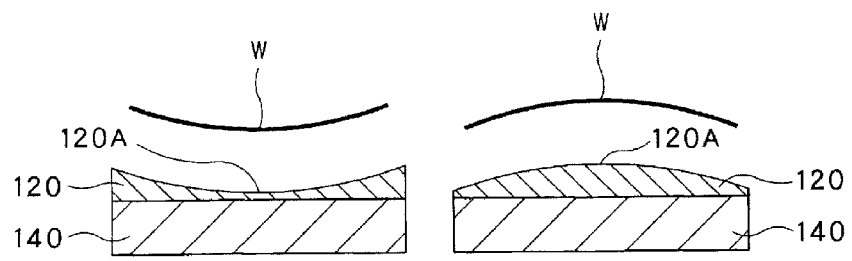
FIG. 11 is a schematic diagram illustrating curved attraction plates.

The top surface 120A of the attraction plate 120 may be flat in overall. The top surface 120A of the attraction plate 120 may be gently curved, as schematically illustrated in FIG. 11. It is known that the wafer W is curved in a certain direction depending on a structure and an array of devices formed on the surface of the wafer W. By using the attraction plate 120 whose top surface 120A is curved to conform to the curve of the wafer W, the attraction of the wafer W can be securely carried out.

Figure 12:
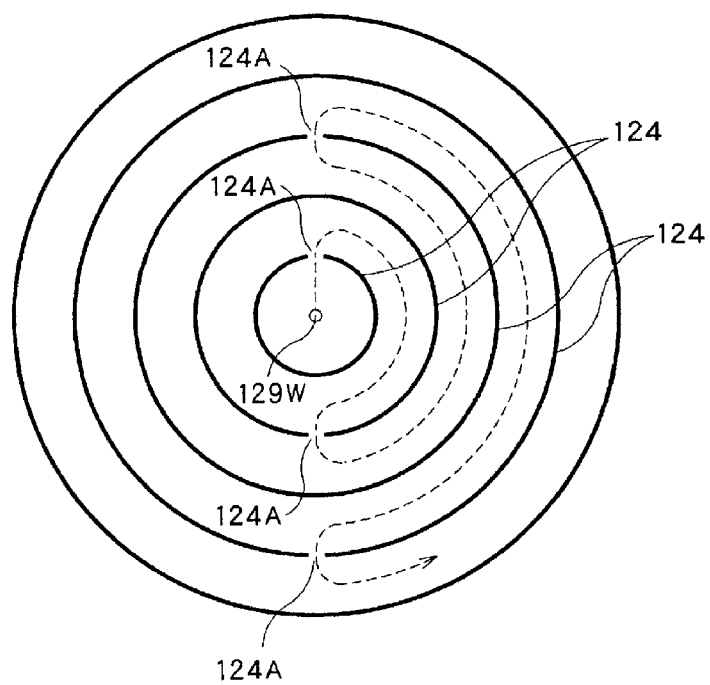
FIG. 12 is a schematic plan view illustrating a modification example of the attraction plate.

In the exemplary embodiment shown in FIG. 6, the recess regions 125W isolated from each other by the partition walls 124 are provided. However, the exemplary embodiment is not limited thereto. By way of example, as schematically illustrated in FIG. 12, the partition walls 124 may be provided with communication paths 124A through which the recess regions 125W are allowed to communicate with each other. In this configuration, only one through hole 129W may be provided at, for example, the central portion of the attraction plate 120. Further, without using the thick partition walls 124, the narrow separation walls 127 may be formed to have the same structure as that of the partition walls 124 in FIG. 12.

As depicted in FIG. 2, a suction/purge unit (suction device) 150 is provided in the vicinity of the rotation axis Ax. The suction/purge unit 150 is equipped with a rotary joint 151 provided within the hollow rotation shaft 200. An upper piece 151A of the rotary joint 151 is connected with a suction line 152W communicating with the plate suction hole 144P and the substrate suction hole 144W of the hot plate 140; and a purge gas supply line 152G communicating with the purge gas supply hole 144G.

Though not shown, the suction line 152W may be branched into a branch suction line, and this branch suction line may be connected to the plate main body 141 of the hot plate 140 directly under the plate suction hole 144P and the substrate suction hole 144W. In this case, vertically extending through holes may be formed through the plate main body 141, and the branch suction line may be connected to each through hole. Likewise, the purge gas supply line 152G may be branched, and this branch purge gas supply line may be connected to the plate main body 141 of the hot plate 140 directly under the purge gas supply hole 144G. In this configuration, vertically extending through holes may be formed through the plate main body 141, and the branch purge gas supply line may be connected to each through hole. The aforementioned branch suction line and the branch purge gas supply line are schematically illustrated in FIG. 10 (see reference numerals 152WB and 152GB, respectively).

Alternatively, the suction line 152W and the purge gas supply line 152G may be connected to a central portion of the plate main body 141 of the hot plate 140. In this case, a path through which the suction line 152W is allowed to communicate with the plate suction hole 144P and the substrate suction hole 144W and a path through which the purge gas supply line 152G is allowed to communicate with the purge gas supply hole 144G are provided within the plate main body 141.

The lower piece 151B of the rotary joint 151 is connected with a suction line 153W communicating with the suction line 152W; and a purge gas supply line 153G communicating with the purge gas supply line 151G. The rotary joint 151 is configured such that the upper piece 151A and the lower piece 151B can be rotated relative to each other while the communication between the suction lines 152W and 153W and the communication between the purge gas supply lines 152G and 153G are maintained. The rotary joint 151 itself having this function is one commonly known.

The suction line 153W is connected to a suction device 154 such as a vacuum pump. The purge gas supply line 153G is connected to a purge gas supply device 155. The suction line 153W is also connected to the purge gas supply device 155. Further, there is also provided a switching device 156 (for example, a three-way valve) configured to switch the connection destination of the suction line 153W between the suction device 154 and the purge gas supply device 155.

The hot plate 140 has therein temperature sensors 146 configured to detect a temperature of the plate main body 141 of the hot plate 140. For example, the temperature sensors 146 may be provided for the ten heating zones 143-1 to 143-10 in one-to-one correspondence. Further, at least one thermo switch 147 is provided near the heater 142 of the hot plate 140 to detect overheating of the heater 142.

Besides the temperature sensors 146 and the thermo switch 147, control signal lines 148A and 148B for transmitting detection signals of the temperature sensors 146 and the thermo switch 147 and a power feed line 149 for supplying power to each heater element 142E of the heater 142 are provided within a space S between the hot plate 140 and the support plate 170.

As depicted in FIG. 2, a switch device 160 is provided in the vicinity of the rotary joint 151. The switch device 160 includes a first electrode unit 161A fixed with respect to the direction of the rotation axis Ax; a second electrode unit 161B configured to be movable in the direction of the rotation axis Ax; and an electrode moving device 162 (elevating device) configured to move the second electrode unit 161B up and down in the direction of the rotation axis Ax.

Figure 7:
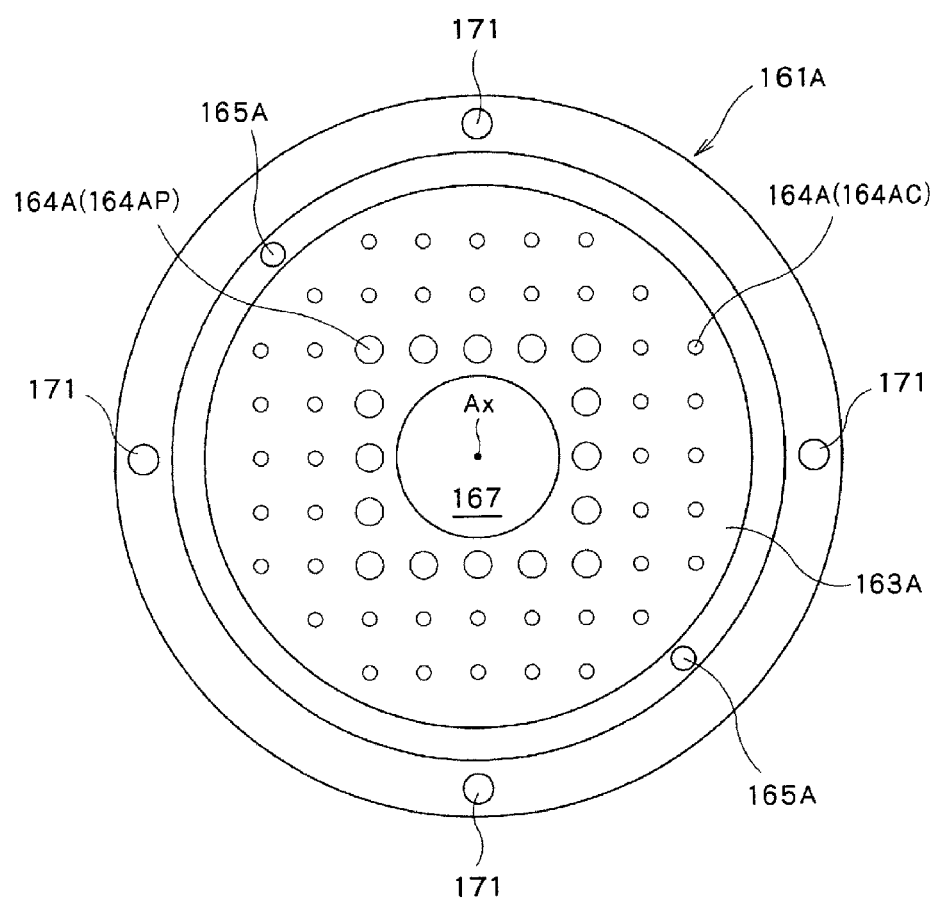
FIG. 7 is a schematic plan view illustrating an example structure of a first electrode unit provided in the processing unit.

As illustrated in FIG. 7, the first electrode unit 161A is equipped with a first electrode supporting body 163A and a plurality of first electrodes 164A supported by the first electrode supporting body 163A. The first electrodes 164A include first electrodes 164AC (indicated by small 'O' in FIG. 7) for control signal communication connected to the control signal lines 148A and 148B; and first electrodes 164AP (indicated by large "O" in FIG. 7) for heater power feed connected to the power feed line 149.

The first electrode supporting body 163A is a circular plate-shaped member in overall. Formed at a central portion of the first electrode supporting body 163A is a circular hole 167 into which the upper piece 151A of the rotary joint 151 is inserted. The upper piece 151A of the rotary joint 151 may be fixed to the first electrode supporting body 163A. A peripheral portion of the first electrode supporting body 163A may be screw-coupled to the support plate 170 by using screw holes 171.

As schematically illustrated in FIG. 2, the second electrode unit 161B is equipped with a second electrode supporting body 163B and a plurality of second electrodes 164B supported by the second electrode supporting body 163B. In overall, the second electrode supporting body 163B is a circular plate-shaped member having the same diameter as that of the first electrode supporting body 163A shown in FIG. 7. Formed at a central portion of the second electrode supporting body 163B is a circular hole through which the lower piece 151B of the rotary joint 151 can pass.

The second electrodes 164B configured to be connected to/disconnected from the first electrodes 164A by being moved up and down with respect to the first electrodes 164A have the same layout as that of the first electrodes 164A. Hereinafter, the second electrodes 164B (power feeding electrode) configured to come into contact with the first electrodes 164AP (power receiving electrode) for heater power feed will also be referred to as "second electrodes 164BP". Further, the second electrodes 164B configured to be brought into contact with the first electrodes 164AC for control signal communication will also be referred to as "second electrodes 164BC". The second electrodes 164BP are connected to a power output terminal of a power feed device (power feeder) 300. The second electrodes 164BC are connected to a control input/output terminal of the power feeder 300.

At least a part of conductive paths 168A, 168B and 169 (see FIG. 2) connecting the second electrodes 164B and the power output terminal and the control input/output terminal of the power feeder 300 is made of a flexible wire. Due to the flexible wire, the entire second electrode unit 161B can be rotated around the rotation axis Ax in a forward rotation direction and in a backward rotation direction from a neutral position at a preset angle while maintaining the electric conduction between the second electrodes 164B and the power feeder 300. The preset angle may be, by way of example, 180 degrees, but not limited thereto. This means that the rotary table 100 can be rotated about ±180 degrees while maintaining the connection between the first electrodes 164A and the second electrodes 164B.

One of the first electrode 164A and the second electrode 164B in each pair may be configured as a pogo pin. In FIG. 2, all the second electrodes 164B are configured as the pogo pins. Here, the term "pogo pin" is widely used to imply an extensible/contractible rod-shaped electrode having a spring embedded therein. Instead of the pogo pin, a socket, a magnet electrode, an induction electrode, or the like may be used as the electrode.

Desirably, there may be provided a lock device 165 configured to lock the first electrode supporting body 163A and the second electrode supporting body 163B not to be rotated relative to each other when the first electrode 164A and the second electrode 164B in each pair are in appropriate contact with each other. By way of example, as shown in FIG. 2, the lock device 165 may be composed of a hole 165A provided at the first electrode supporting body 163A; and a pin 165B provided at the second electrode supporting body 163B and configured to be fitted into the hole 165A.

It may be desirable to provide a device 172 (schematically illustrated in FIG. 2) configured to detect an appropriate contact between the first electrode 164A and the second electrode 164B in each pair. This device 172 may be an angular position sensor configured to detect a state in which an angular positional relationship between the first electrode supporting body 163A and the second electrode supporting body 163B is appropriate. Alternatively, this device 172 may be a distance sensor (not shown) configured to detect a state in which a distance between the first electrode supporting body 163A and the second electrode supporting body 163B in the direction of the rotation axis Ax is appropriate. Still alternatively, a contact type sensor (not shown) configured to detect an appropriate engagement of the pin 165B into the hole 165A of the lock device 165 may be provided.

The electrode moving device 162 schematically illustrated in FIG. 2 may be equipped with, though not shown, a push rod configured to push the second electrode supporting body 163B upwards; and an elevating device (an air cylinder, a ball screw, or the like) configured to move the push rod up and down (first configuration example). For example, when using this configuration, a permanent magnet may be provided at the first electrode supporting body 163A, and an electromagnet may be provided at the second electrode supporting body 163B. With this configuration, when necessary, the first electrode unit 161A and the second electrode unit 161B can be coupled not to be moved relative to each other in the vertical direction, and the first electrode unit 161A and the second electrode unit 161B can be disconnected from each other.

When adopting the first configuration example, if the connection/disconnection between the first electrode unit 161A and the second electrode unit 161B are performed at the same angular position on the rotary table 100, the second electrode unit 161B need not be supported to be rotatable around the rotation axis Ax. That is, only a member (for example, the aforementioned push rod, or another support table) configured to support the second electrode unit 161B when the first electrode unit 161A and the second electrode unit 161B are disconnected from each other needs to be provided.

Instead of the aforementioned first configuration example, a second configuration example may be adopted. Though not illustrated in detail, the second configuration example of the electrode moving device 162 includes a first ring-shaped member having a circular ring shape centered on the rotation axis Ax; a second ring-shaped member configured to support the first ring-shaped member; a bearing provided between the first and second ring-shaped members and configured to allow the first and second ring-shaped members to be rotated relative to each other; and an elevating device (such as an air cylinder, a ball screw, or the like) configured to move the second ring-shaped member up and down.

In the first configuration example and the second configuration example, it is possible to rotate the first electrode unit 161A and the second electrode unit 161B together within a limited range while keeping the first electrode 164A and the second electrode 164B of each pair in an appropriate contact with each other.

The electric driving unit 102 of the rotary table 100 has a positioning function of stopping the rotary table 100 at a certain rotational angular position. This positioning function can be implemented by rotating a motor of the electric driving unit 102 based on a detection value of a rotary encoder embedded in the rotary table 100 (or a member rotated by the rotary table 100). By raising the second electrode unit 161B with the electrode moving device 162 while keeping the rotary table 100 stopped at the preset rotational angular position, corresponding electrodes of the first electrode unit 161A and the second electrode unit 161B can be brought into contact with each other appropriately. When disconnecting the second electrode unit 161B from the first electrode unit 161A, it is desirable to perform this disconnection in the state that the rotary table 100 is stopped at the preset rotational angular position.

As stated above, the various electronic components (heater, wiring, sensors) are disposed within the space S between the attraction plate 120 and the support plate 170 and at the positions facing the space S. The periphery cover body 180 suppresses a processing liquid supplied to the wafer W, particularly, a corrosive chemical liquid from entering the space S, thus protecting the electronic components. A purge gas ($N_2$ gas) may be supplied into the space S through a pipeline (not shown) branched from the purge gas supply line 152G. By supplying the purge gas into the space S in this way, a corrosive gas originated from the chemical liquid can be suppressed from reaching the inside of the space S from the outside thereof, so that the space S can be maintained in a non-corrosive atmosphere.

As shown in FIG. 2, the periphery cover body 180 has an upper portion 181, a side peripheral portion 182 and a lower portion 183. The upper portion 181 is protruded above the attraction plate 120 and connected to the attraction plate 120. The lower portion 183 of the periphery cover body 180 is coupled to the support plate 170.

An inner edge of the upper portion 181 of the periphery cover body 180 is located at an inner side than an outer edge of the attraction plate 120 in a radial direction thereof. The upper portion 181 has a circular ring-shaped bottom surface 184 in contact with the top surface of the attraction plate 120; an inclined circular ring-shaped inner peripheral surface 185 starting from an inner edge of the bottom surface 184; and a circular ring-shaped outer peripheral surface 186 extending substantially horizontally outwards in the radial direction from an outer edge of the inner peripheral surface 185. The inner peripheral surface 185 is inclined to be lowered as it approaches the central portion of the attraction plate 120.

It is desirable to provide a seal between the top surface 120A of the attraction plate 120 and the bottom surface 184 of the upper portion 181 of the periphery cover body 180 to suppress the liquid from being introduced. The seal may be an O-ring 192 disposed between the top surface 120A and the bottom surface 184.

As depicted in FIG. 5, a part of the plate bottom surface suction path groove 121P extends in the circumferential direction at the outermost portion of the attraction plate 120. Further, as shown in FIG. 6, a groove 193 extends continuously in the circumferential direction at the outermost portion of the top surface 120A of the attraction plate 120. As illustrated in FIG. 9, the plate bottom surface suction path groove 121P at the outermost portions and the groove 193 communicate with each other via multiple through holes 129P which are formed through the attraction plate 120 in a thickness direction and arranged at a regular distance therebetween in the circumferential direction. The bottom surface 184 of the upper portion 181 of the periphery cover body 180 is placed on the groove 193. Accordingly, the bottom surface 184 of the upper portion 181 of the periphery cover body 180 is attracted to the top surface 120A of the attraction plate 120 by a negative pressure acting on the plate bottom surface suction path groove 121P. Since the O-ring 192 is squashed through this attraction, secure sealing is achieved.

A height of the outer peripheral surface 186, that is, a top portion of the periphery cover body 180 is higher than a height of the wafer W held by the attraction plate 120. Accordingly, if the processing liquid is supplied onto the top surface of the wafer W in the state that the wafer W is held by the attraction plate 120, a liquid accumulation (puddle), in which the wafer W can be immersed so that the top surface of the wafer W is located under a liquid surface LS, can be formed. That is, the upper portion 181 of the periphery cover body 180 forms an embankment surrounding the wafer W held by the attraction plate 120. A recess portion in which the processing liquid can be stored is formed and confined by this embankment and the attraction plate 120.

An inclination of the inner peripheral surface 185 of the upper portion 181 of the periphery cover body 180 facilitates outward scattering of the processing liquid within the aforementioned recess portion when the rotary table 100 is rotated at a high speed. That is, this inclination suppresses the liquid from staying on the inner peripheral surface of the upper portion 181 of the periphery cover body 180 when the rotary table 100 is rotated at the high speed.

A rotary cup 188 (rotary liquid-receiving member) configured to be rotated along with the periphery cover body 180 is provided at an outside of the periphery cover body 180 in the radial direction. The rotary cup 188 is connected to a constituent component of the rotary table 100, that is, the periphery cover body 180 in the shown example, via a plurality of connecting members 189 arranged at a regular distance therebetween in the circumferential direction. An upper end of the rotary cup 188 is located at a height where the processing liquid scattered from the wafer W can be received. A passageway 190 through which the processing liquid scattered from the wafer W flows down is formed between an outer surface of the side peripheral portion 182 of the periphery cover body 180 and an inner surface of the rotary cup 188.

A liquid recovery cup 800 surrounds the rotary table 100 and collects the processing liquid scattered from the wafer W. In the shown exemplary embodiment, the liquid recovery cup 800 includes a stationary outer cup component 801, a first movable cup component 802 and a second movable cup component 803 configured to be movable up and down, and a stationary inner cup component 804. A first drain passageway 806, a second drain passageway 807 and a third drain passageway 808 are formed between the neighboring cup components (that is, between 801 and 802, between 802 and 803, and between 803 and 804). By varying the positions of the first and second movable cup components 802 and 803, the processing liquid flown out from the passageway 190 between the periphery cover body 180 and the rotary cup 188 can be guided into a selected one of the three drain passageways 806 to 808. Each of the first drain passageway 806, the second drain passageway 807 and the third drain passageway 808 is connected to any one of an acidic liquid drain passageway, an alkaline liquid drain passageway and an organic liquid drain passageway (all of which are not illustrated) which are provided in a semiconductor manufacturing factory. A non-illustrated gas-liquid separating structure is provided within each of the first drain passageway 806, the second drain passageway 807 and the third drain passageway 808. The first drain passageway 806, the second drain passageway 807 and the third drain passageway 808 are connected to and suctioned by a factory exhaust system via an exhaust device (not shown) such as an ejector. This liquid recovery cup 800 is well-known by Japanese Patent Laid-open Publication No. 2012-129462, Japanese Patent Laid-open Publication No. 2014-123713, Japanese laid-open publication pertinent to the present application by the present applicant, and so forth. For details of this liquid recovery cup, these documents may be referred to.

Three lift pin holes 128L and three lift pin hoes 171L are formed at the attraction plate 120 and the support plate 170, respectively, to be aligned with the three lift pin holes 145L of the hot plate 140 in the direction of the rotation axis Ax.

The rotary table 100 is equipped with a plurality of (three in the shown example) lift pins 211 inserted through the lift pin holes 145L, 128L and 171L. The lift pins 211 can be moved between a transfer position (raised position) where an upper end of the lift pin 211 protrudes above the top surface 120A of the attraction plate 120 and a processing position (lowered position) where the upper end of the lift pin 211 is located under the top surface 120A of the attraction plate 120.

A push rod 212 is provided under each lift pin 211. The push rod 212 can be moved up and down by an elevating device 213, for example, an air cylinder. By pushing lower ends of the lift pins 211 upwards with the push rods 212, the lift pins 211 can be raised to the transfer position. Alternatively, the push rods 212 may be provided at a ring-shaped support body (not shown) centered on the rotation axis Ax and moved up and down by moving the ring-shaped support body up and down by a common elevating device.

The wafer W placed on the lift pins 211 at the transfer position is located at a height position higher than an upper end 809 of the stationary outer cup component 801, and this wafer W can be transferred to/from an arm (see FIG. 1) of the substrate transfer device 17 advanced into the processing unit 16.

If the push rod 212 is distanced away from the lift pin 211, the lift pin 211 is lowered down to the processing position by an elastic force of a return spring 214 and held at this processing position. In FIG. 2, a reference numeral 215 denotes a guide member configured to guide the vertical movement of the lift pin 211, and a reference numeral 216 indicates a spring seat configured to receive the return spring 214. Further, a circular ring-shaped recess 810 is formed at the stationary inner cup component 804 to allow rotation of the spring seat 216 around the rotation axis Ax.

The processing liquid supply 700 is equipped with a multiple number of nozzles. These nozzles include a chemical liquid nozzle 701, a rinse nozzle 702, and a drying accelerator liquid nozzle 703. A chemical liquid is supplied into the chemical liquid nozzle 701 from a chemical liquid source 701A via a chemical liquid supply mechanism 701B including a flow control device (not shown) such as a flow rate control valve and an opening/closing valve which are provided at a chemical liquid supply line (pipeline) 701C. A rinse liquid is supplied into the rinse nozzle 702 from a rinse liquid source 702A via a rinse liquid supply mechanism 702B including a flow control device (not shown) such as a flow rate control valve and an opening/closing valve which are provided at a rinse liquid supply line (pipeline) 702C. A drying accelerator liquid, for example, IPA (Isopropyl Alcohol) is supplied into the drying accelerator liquid nozzle 703 from a drying accelerator liquid source 703A via a drying accelerator liquid supply mechanism 703B including a flow control device (not shown) such as a flow rate control valve and an opening/closing valve which are provided at a drying accelerator supply line (pipeline) 703C.

The chemical liquid supply line 701C may be equipped with a heater 701D as a temperature control device for controlling a temperature of the chemical liquid. Further, a tape heater (not shown) for controlling the temperature of the chemical liquid may be provided at a pipeline constituting the chemical liquid supply line 701C. Likewise, the rinse liquid supply line 702C may also be equipped with such a heater.

The chemical liquid nozzle 701, the rinse nozzle 702 and the drying accelerator liquid nozzle 703 are supported by a leading end of a nozzle arm 704. A base end of the nozzle arm 704 is supported by a nozzle arm driving device 705 configured to move up and down and rotate the nozzle arm 704. The chemical liquid nozzle 701, the rinse nozzle 702 and the drying accelerator liquid nozzle 703 can be placed at a certain position above the wafer W in the radial direction of the wafer W (a position with respect to the radial direction of the wafer W) by the nozzle arm moving device 705.

Disposed at a ceiling of the housing 900 are a wafer sensor 901 configured to detect a presence or absence of the wafer W on the rotary table 100 and one or more infrared thermometers 902 (only one is illustrated) configured to detect a temperature of the wafer W (or a temperature of the processing liquid on the wafer W). In a configuration in which multiple infrared thermometers 902 are provided, it is desirable that the individual infrared thermometers 902 are configured to detect a temperature of regions of the wafer W corresponding to the heating zones 143-1 to 143-10, respectively.

Now, with reference to a time chart of FIG. 8, an operation of the processing unit 16 will be explained for a case where the processing unit 16 performs a chemical liquid cleaning processing. The operation to be described below can be carried out under the control of the control device 4 (controller 18) shown in FIG. 1 which controls operations of the various kinds of components of the processing unit 16.

Figure 8:
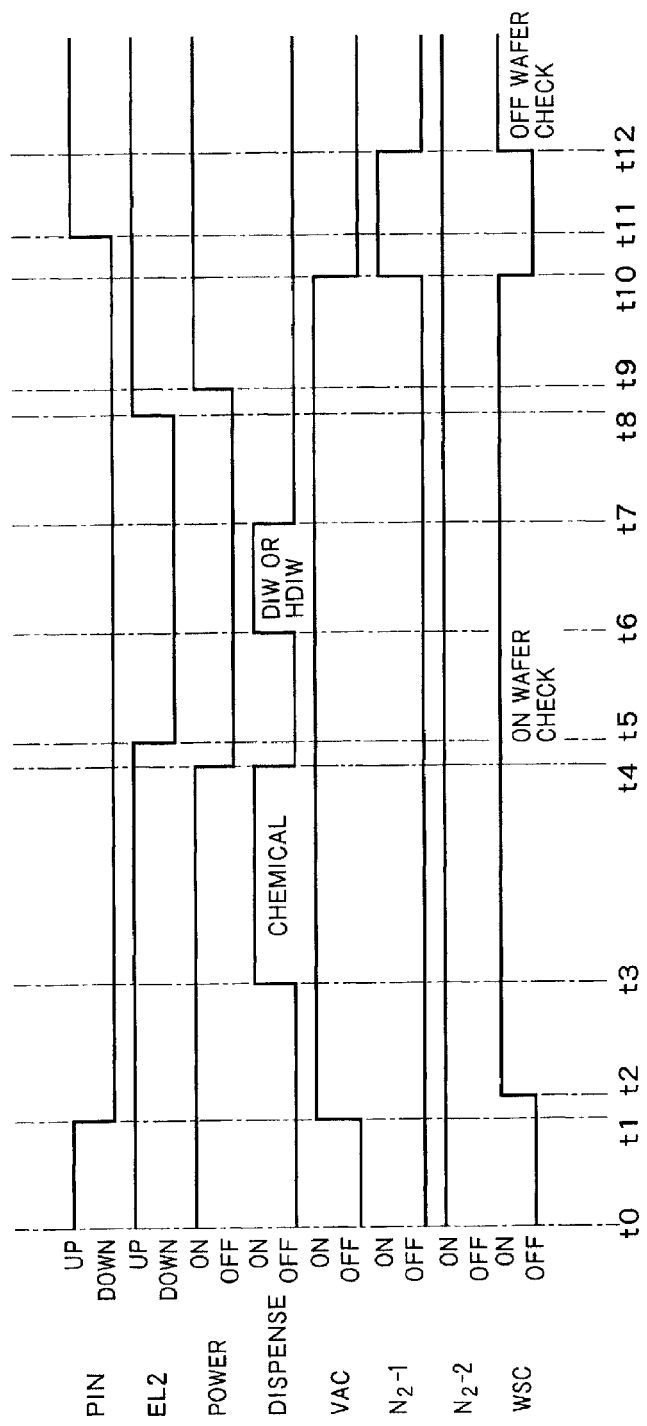
FIG. 8 is a time chart for describing example operations of various constituent components of the processing unit.

On the time chart of FIG. 8, a horizontal axis represents a lapse of time. A vertical axis shows the following items in sequence from the top.

"PIN" denotes a height position of the lift pin 211. "UP" indicates that the lift pin 211 is located at the transfer position, and "DOWN" indicates that the lift pin 211 is located at the processing position.

"EL2" denotes a height position of the second electrode unit 161B. "UP" indicates that the second electrode unit 161B is located at a height position where it is in contact with the first electrode unit 161A, and "DOWN" indicates that the second electrode unit 161B is located at a height position distanced apart from the first electrode unit 161A.

"POWER" denotes a state of the power feed to the heater 142 from the power feeder 300. "ON" indicates a state where the power feed is being performed, and "OFF" indicates a state in which the power feed is stopped.

"VAC" denotes a state of the application of the suction force from the suction device 154 to the bottom surface suction path groove 121W of the attraction plate 120. "ON" indicates that the suctioning is being performed, and "OFF" indicates that the suctioning is stopped.

"$N_2$-1" indicates a state of the supply of the purge gas from the purge gas supply device 155 into the bottom surface suction path groove 121W of the attraction plate 120. "ON" indicates that the supply of the purge gas is being performed, and "OFF" indicates the supply of the purge gas is stopped.

"$N_2$-2" denotes a state of the supply of the purge gas from the purge gas supply device 155 into the bottom surface purge path groove 121G of the attraction plate 120. "ON" indicates that the supply of the purge gas is being performed, and "OFF" indicates the supply of the purge gas is stopped.

"WSC" denotes an operational status of the wafer sensor 901. "ON" indicates a state in which the wafer sensor 901 is detecting the presence or absence of the wafer W on the attraction plate 120, and "OFF" indicates a state in which the wafer sensor 901 does not perform the detection. Further, "On Wafer Check" is a detecting operation of checking whether the wafer W is present on the attraction plate 120. "OFF Wafer Check" is a detecting operation of checking whether the wafer W is removed from the attraction plate 120 completely.

[Carry-In Process (Holding Process) for Wafer W]

The arm of the substrate transfer device 17 (see FIG. 1) advances into the processing unit 16 to be placed directly above the attraction plate 120, and the lift pins 211 are placed at the transfer position (times t0 to t1). In this state, the arm of the substrate transfer device 17 is lowered. Accordingly, the wafer W is distanced apart from the arm by being placed on the upper ends of the lift pins 211. Then, the arm of the substrate transfer device 17 is retreated out of the processing unit 16. The lift pins 211 are lowered down to the processing position, and in the meanwhile, the wafer W is placed on the top surface 120A of the attraction plate 120 (time t1).

Subsequently, as the suction device 154 is operated, the attraction plate 120 is attracted to the hot plate 140, and the wafer W is attracted to the attraction plate 120 (time t1). Thereafter, an inspection by the wafer sensor 901 to inspect whether the wafer W is appropriately attracted to the attraction plate 120 is begun (time t2).

The purge gas (e.g., $N_2$ gas) is constantly supplied to the outermost recess region 125G on the top surface of the attraction plate 120 from the purge gas supply device 155. Accordingly, even if there exists a gap between the contact surfaces of the peripheral portion of the bottom surface of the wafer W and the peripheral portion of the attraction plate 120, the processing liquid is suppressed from being introduced somewhere between the peripheral portion of the wafer W and the peripheral portion of the attraction plate 120 through this gap.

The second electrode unit 161B is placed at the raised position and the first electrodes 164A of the first electrode unit 161A and the second electrodes 164B of the second electrode unit 161B are in contact with each other from a time before the carry-in of the wafer W is begun (before time t0). The power is fed to the heater 142 of the hot plate 140 from the power feeder 300, and the heater 142 of the hot plate 140 is in a pre-heated state.

[Wafer Heating Process]

Once the wafer W is attracted to the attraction plate 120, the power fed to the heater 142 of the hot plate 140 is adjusted to allow the temperature of the hot plate 140 to reach a preset temperature (a temperature where the wafer W on the attraction plate 120 is heated to a temperature appropriate for a processing performed afterwards) (times t1 to t3).

[Chemical Liquid Processing Process (Including Puddle Forming Process and Agitating Process)]

Subsequently, the chemical liquid nozzle 701 is placed directly above the central portion of the wafer W by the nozzle arm of the processing liquid supply 700. In this state, the chemical liquid whose temperature is adjusted is supplied onto the front surface (top surface) of the wafer W from the chemical liquid nozzle 701 (times t3 to t4). The supply of the chemical liquid is continued until the liquid surface LS of the chemical liquid becomes higher than the top surface of the wafer W. At this time, the upper portion 181 of the periphery cover body 180 serves as the embankment, suppressing the chemical liquid from flowing over to the outside of the rotary table 100.

During the supply of the chemical liquid or after the supply of the chemical liquid, the rotary table 100 is rotated in the forward direction and in the backward direction alternately (for example, by about 180 degrees). Accordingly, the chemical liquid is agitated, and the reaction between the front surface of the wafer W and the chemical liquid can be uniformed within the surface of the wafer W.

In general, the temperature of the peripheral portion of the wafer W tends to be reduced due to an influence of an air flow attracted into the liquid recovery cup. Among the multiple number of heater elements 142E of the heater 142, the power to be fed to the heater elements 142E in charge of the heating of the peripheral region of the wafer W (the heating zones 143-1 to 143-4) may be increased. As a result, the temperature of the wafer W can be uniformed within the surface thereof, so that the reaction between the front surface of the wafer W and the chemical liquid can be uniformed within the surface of the wafer W.

During this chemical liquid processing, the control over the power to be fed to the heater 142 can be carried out based on the detection value of the temperature sensor 146 provided at the hot plate 140. Instead, the control over the power to be fed to the heater 142 may be performed based on the detection value of the infrared thermometer 902 which detects the surface temperature of the wafer W. By using the detection value of the infrared thermometer 902, a more accurate temperature control of the wafer W can be achieved. The control over the power to be fed to the heater 142 may be performed based on the detection value of the temperature sensor 146 in an early stage of the chemical liquid processing, and then, based on the detection value of the infrared thermometer 902 in a later stage thereof.

[Chemical Liquid Scattering Process (Chemical Liquid Removing Process)]

Upon the completion of the chemical liquid processing, the power feed to the heater 142 from the power feeder 300 is first stopped (time t4), and the second electrode unit 161B is moved to the lowered position (time t5). By stopping the power feed first, generation of a spark between the electrodes can be avoided when the second electrodes 161B are lowered.

Then, by rotating the rotary table 100 at a high speed, the chemical liquid on the wafer W is scattered outwards by the centrifugal force (times t5 to t6). Since the inner peripheral surface 185 of the upper portion 181 of the periphery cover body 180 is inclined, the chemical liquid existing at the inner side than the upper portion 181 in the radial direction (including the chemical liquid on the wafer W) is smoothly removed completely. The scattered chemical liquid falls down through the passageway 190 between the rotary cup 188 and the periphery cover body 180 to be received by the liquid recovery cup 800. At this time, the first and second movable cup components 802 and 803 are located at the appropriate positions so that the scattered chemical liquid is guided into the drain passageway (one of the first drain passageway 806, the second drain passageway 807 and the third drain passageway 808) suitable for the kind of the chemical liquid.

[Rinsing Process]

Subsequently, while rotating the rotary table 100 at a low speed, the rinse nozzle 702 is placed directly above the central portion of the wafer W, and the rinse liquid is supplied from the rinse nozzle 702 (times t6 to t7). Accordingly, the chemical liquid remaining at the inner side than the upper portion 181 in the radial direction (including the chemical liquid left on the wafer W) is completely washed away by the rinse liquid.

The rinse liquid supplied from the rinse nozzle 702 may be a rinse liquid of a room temperature or a heated rinse liquid. When supplying the heated rinse liquid, it is possible to suppress the temperatures of the attraction plate 120 and the hot plate 140 from being declined. The heated rinse liquid may be supplied from a factory supply system. Instead, a heater (not shown) may be provided on the rinse liquid supply line connected between the rinse liquid source 702A and the rinse nozzle 702 to heat the rinse liquid of the room temperature.

[Scattering Drying Process]

Then, by stopping the discharge of the rinse liquid from the rinse nozzle 702 while rotating the rotary table 100 at a high speed, the whole rinse liquid remaining at the inner region than the upper portion 181 in the radial direction (including the rinse liquid left on the wafer W) is scattered outwards by a centrifugal force (times t7 to t8). Accordingly, the wafer W is dried.

Between the rinsing processing and the drying processing, the drying accelerator liquid may be supplied onto the wafer W to replace the whole rinse liquid remaining at the inner region than the upper portion 181 in the radial direction (including the rinse liquid remaining on the wafer W) with the drying accelerator liquid. Desirably, the drying accelerator liquid may have higher volatility and lower surface tension as compared to the rinse liquid. The drying accelerator liquid may be, by way of example, but not limitation, IPA (Isopropyl Alcohol).

After the scattering drying process, a heating/drying process of heating the wafer W may be performed. In this case, the rotation of the rotary table 100 is stopped first. Then, the second electrode unit 161B is moved to the raised position (time t8). Then, the power is fed from the power feeder 300 to the heater 142 (time t9). Accordingly, the temperature of the wafer W is raised (desirably, at a high speed), and the rinse liquid (or the drying accelerator liquid) remaining at the peripheral portion of the wafer W and the vicinity thereof is removed by being evaporated. Since the front surface of the wafer W is dried sufficiently by performing the scattering drying process with the aforementioned IPA, the heating/drying by the heater 142 need not be performed. That is, on the time chart of FIG. 8, the operations from the time between the times t7 and t8 and the time between the times t10 to t11 may be omitted.

[Wafer Carry-Out Process]

Thereafter, by switching the switching device (three-way valve) 156, the connection of the suction line 153W to the suction device 154 is cut, and the suction line 153W is connected to the purge gas supply device 155. Accordingly, the purge gas is supplied into the plate bottom surface suction path groove 121P, and, further, the purge gas is supplied into the recess region 125W on the top surface 120A of the attraction plate 120 through the substrate bottom surface suction path groove 121W. As a result, the attraction of the wafer W to the attraction plate 120 is released (time t10).

Along with the aforementioned operation, the attraction of the attraction plate 120 to the hot plate 140 is also released. Since the attraction of the attraction plate 120 to the hot plate 140 need not be released whenever the processing on the single sheet of wafer W is completed, a pipeline system in which this release of the attraction is not performed may be used.

Subsequently, the lift pins 211 are raised to the transfer position (time t11). Since the attraction of the wafer W to the attraction plate 120 is released through the aforementioned purging, the wafer W can be easily separated from the attraction plate 120. Therefore, the damage on the wafer W can be avoided.

Then, the wafer W placed on the lift pins 211 is lifted and taken by the arm of the substrate transfer device 17 (see FIG. 1) to be carried to the outside of the processing unit 16 (time t12). Thereafter, it is inspected by the wafer sensor 901 whether the wafer W does not exist on the attraction plate 120. Through the above-stated operations, a series of processings upon the single sheet of wafer W is ended.

The chemical liquid used in the chemical liquid cleaning processing may be, by way of non-limiting example, SC1, SPM (sulfuric acid hydrogen peroxide mixture), $H_3PO_4$ (phosphoric acid aqueous solution) or the like. As an example, the temperature of the SC1 is in the range from a room temperature to 70° C.; the temperature of the SPM is in the range from 100° C. to 120° C.; and the temperature of the $H_3PO_4$ is in the range from 100° C. to 165° C. When the chemical liquid is supplied at a temperature higher than the room temperature, the aforementioned exemplary embodiment is advantageous.

According to the above-described exemplary embodiment, since the attraction plate 120 is attracted to the hot plate 140 by the suctioning, it is possible to replace the attraction plate 120 easily. Thus, when the attraction plate 120 is contaminated or damaged, for example, the attraction plate 120 can be easily replaced, and the problem can be solved easily. Further, since the attraction plate 120 is in firm contact with the hot plate 140 through the suctioning, the sufficient thermal conduction between the attraction plate 120 and the hot plate 140 can be achieved. That is, the decrease of the thermal conduction that might be caused by configuring the attraction plate 120 and the hot plate 140 as individual members can be minimized. Furthermore, as stated above, when processing the wafers W having different curved patterns, it is possible to cope with this variety easily by replacing the attraction plate 120.

In the above-described exemplary embodiment, the plate bottom surface suction path groove 121P and the substrate bottom surface suction path groove 121W, which are formed on the bottom surface 120B of the attraction plate 120, are disconnected from each other. However, the exemplary embodiment is not limited thereto. The bottom surface suction path grooves 121P and 121W may be combined by being allowed to communicate with each other. In such a case, a through hole through which the combined path groove and the recess region 125W of the top surface 120A communicate with each other may be formed at the combined path groove. Further, in this case, the plate suction hole 144P and the substrate suction hole 144W need not be provided separately on the top surface of the plate main body 141.

By using the above-described processing unit 16, a plating processing (particularly, an electroless plating processing) may be performed as the liquid processing. In case of performing the electroless plating processing, a pre-cleaning process (chemical liquid cleaning process), a plating process, a rinsing process, a post-cleaning process (chemical liquid cleaning process), an IPA replacement process, a scattering drying process (a subsequent heating/drying process when necessary) are performed in sequence. In the plating process among these processes, an alkaline chemical liquid (electroless plating liquid) having a temperature ranging from, e.g., 50° C. to 70° C. is used as the processing liquid. Processing liquids (chemical liquids and rinse liquids) used in the pre-cleaning process, the rinsing process, the post-cleaning process and the IPA replacement process are all of a room temperature. Thus, in the plating process, the same process as the wafer heating process and the chemical liquid processing process needs to be performed. In the pre-cleaning process, the rinsing process, the post-cleaning process and the IPA replacement process, the necessary processing liquids need to be supplied onto the top surface of the wafer W attracted to the attraction plate 120 while rotating the rotary table in the state that the first electrode 164A and the second electrode 164B are spaced apart from each other. Here, enough nozzles and processing liquid sources to supply the necessary processing liquids are provided in the processing liquid supply 700.

According to the exemplary embodiments, the part (attraction plate) of the rotary table configured to be in contact with the substrate can be easily replaced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a rotary table comprising a base plate and an attraction plate,
   the base plate having a front surface in which at least one suction hole is provided, and
   the attraction plate having a front surface contacted with a non-processing surface of a substrate to attract the substrate; a rear surface contacted with the front surface of the base plate; and at least one through hole through which the front surface of the attraction plate and the rear surface of the attraction plate are connected;
a rotation driving device configured to rotate the rotary table around a rotation axis; and
a suction device configured to act a suction force on the at least one suction hole of the base plate, configured to firmly contact the base plate with the attraction plate by acting the suction force between the base plate and the attraction plate, and configured to firmly contact the attraction plate with the substrate by acting the suction force between the attraction plate and the substrate through the at least one through hole.

2. The substrate processing apparatus of claim 1,
wherein at least one front surface suction path groove communicating with the at least one through hole is formed in the front surface of the attraction plate,
at least one rear surface suction path groove communicating with the at least one suction hole of the base plate is formed in the rear surface of the attraction plate, and
the at least one front surface suction path groove distributes the suction force within the front surface of the attraction plate.

3. The substrate processing apparatus of claim 2,
wherein the at least one suction hole of the base plate includes a first suction hole and a second suction hole,
the at least one rear surface suction path groove includes a first rear surface suction path groove communicating with the first suction hole, and a second rear surface suction path groove communicating with the second suction hole,
the suction force acting on the first rear surface suction path groove firmly contacts the base plate with the attraction plate, and the first rear surface suction path groove distributes the suction force within the rear surface of the attraction plate, and
the at least one through hole communicate the second rear surface suction path groove with the at least one front surface suction path groove, and the suction force acting on the at least one front surface suction path groove through the second rear surface suction path groove and the at least one through hole firmly contacts the attraction plate with the substrate.

4. The substrate processing apparatus of claim 3,
wherein the at least one front surface suction path groove includes multiple front surface suction path grooves, and the multiple front surface suction path grooves are arranged concentrically,
the at least one through hole includes multiple through holes, and
the multiple through holes communicate with the front surface suction path grooves in one-to-one correspondence.

5. The substrate processing apparatus of claim 4, further comprising:
a purge gas supply configured to supply a purge gas; and
a switching device configured to switch a state in which the purge gas supply is connected to, among the at least one suction hole of the base plate, at least a suction hole communicating with the at least one front surface suction path groove and a state in which the suction device is connected to at least the suction hole communicating with the at least one front surface suction path groove.

6. The substrate processing apparatus of claim 3, further comprising:
a purge gas supply configured to supply a purge gas; and
a switching device configured to switch a state in which the purge gas supply is connected to, among the at least one suction hole of the base plate, at least a suction hole communicating with the at least one front surface suction path groove and a state in which the suction device is connected to at least the suction hole communicating with the at least one front surface suction path groove.

7. The substrate processing apparatus of claim 2,
wherein the at least one front surface suction path groove includes multiple front surface suction path grooves, and the multiple front surface suction path grooves are arranged concentrically,
the at least one through hole includes multiple through holes, and
the multiple through holes communicate with the front surface suction path grooves in one-to-one correspondence.

8. The substrate processing apparatus of claim 7, further comprising:
a purge gas supply configured to supply a purge gas; and
a switching device configured to switch a state in which the purge gas supply is connected to, among the at least one suction hole of the base plate, at least a suction hole communicating with the at least one front surface suction path groove and a state in which the suction device is connected to at least the suction hole communicating with the at least one front surface suction path groove.

9. The substrate processing apparatus of claim 2, further comprising:
a purge gas supply configured to supply a purge gas; and
a switching device configured to switch a state in which the purge gas supply is connected to, among the at least one suction hole of the base plate, at least a suction hole communicating with the at least one front surface suction path groove and a state in which the suction device is connected to at least the suction hole communicating with the at least one front surface suction path groove.

10. The substrate processing apparatus of claim 1, further comprising:
a purge gas supply configured to supply a purge gas,
wherein a purge path groove continuously extending in a circumferential direction is formed on a peripheral portion of the front surface of the attraction plate,
a purge gas supply hole communicating with the purge gas supply is formed in the front surface of the base plate,
a communication hole is formed through the attraction plate in a thickness direction thereof, and communicates the purge gas supply hole with the purge path groove, and
the purge gas is configured to suppress a fluid from being introduced into a gap between the attraction plate and a peripheral portion of the substrate.

11. The substrate processing apparatus of claim 1, further comprising:
multiple lift pins configured to move the substrate up and down to place the substrate on the attraction plate and separate the substrate from the attraction plate; and
a lift pin elevating device configured to move the multiple lift pins up and down,
wherein through holes are formed through the attraction plate and the base plate at positions where the lift pins pass therethrough when the attraction plate is contacted with the base plate in a preset positional relationship and when the substrate is contacted with the attraction plate in a preset positional relationship.

12. The substrate processing apparatus of claim 1, wherein the base plate is formed of a hot plate equipped with an electric heater.

13. The substrate processing apparatus of claim 12, wherein the attraction plate is thinner than the hot plate.

14. The substrate processing apparatus of claim 1, wherein a central portion of the front surface of the attraction plate is higher than a peripheral portion thereof, or the peripheral portion of the front surface of the attraction plate is higher than the central portion thereof.

15. The substrate processing apparatus of claim 1, wherein the attraction plate is formed of a thermal conductive ceramics having a thermal conductivity equal to or higher than 150 W/m·k.

16. The substrate processing apparatus of claim 1, wherein the attraction plate and the base plate have a circular shape, when viewed from a direction of the rotation axis.

17. The substrate processing apparatus of claim 16, wherein the attraction plate has a diameter equal to or larger than a diameter of the substrate, when viewed from the direction of the rotation axis.

\* \* \* \* \*